(12) United States Patent
Sun

(10) Patent No.: US 10,998,171 B2
(45) Date of Patent: May 4, 2021

(54) PLASMA SOURCE AND SEMICONDUCTOR PROCESSING APPARATUS

(71) Applicant: BEIJING NAURA MICROELECTRONICS EQUIPMENT CO., LTD, Beijing (CN)

(72) Inventor: Baolin Sun, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 243 days.

(21) Appl. No.: 16/261,389

(22) Filed: Jan. 29, 2019

(65) Prior Publication Data

US 2019/0180983 A1   Jun. 13, 2019

Related U.S. Application Data

(63) Continuation of application No. PCT/CN2016/106936, filed on Nov. 23, 2016.

(30) Foreign Application Priority Data

Aug. 2, 2016  (CN) .......................... 201610635952.X

(51) Int. Cl.
*H01J 37/32* (2006.01)
*H01L 21/67* (2006.01)

(52) U.S. Cl.
CPC ....... *H01J 37/3244* (2013.01); *H01J 37/3211* (2013.01); *H01J 37/32467* (2013.01); *H01J 37/32522* (2013.01); *H01L 21/67017* (2013.01); *H01J 2237/002* (2013.01)

(58) Field of Classification Search
CPC ................. H01J 37/321; H01J 37/3244; H01J 37/32467; H01J 37/3211; H01J 37/32449; H01J 37/32522; H01J 2237/002; H01L 21/67017

See application file for complete search history.

(56) References Cited

U.S. PATENT DOCUMENTS

| 5,861,601 | A | 1/1999 | Sato et al. |
| 2005/0145341 | A1 | 7/2005 | Suzuki |

FOREIGN PATENT DOCUMENTS

| CN | 101877304 | B | 6/2014 |
| CN | 104099584 | A | 10/2014 |
| CN | 104867801 | A | 8/2015 |
| CN | 105632858 | A | 6/2016 |
| JP | 09055372 | A * | 2/1997 |

(Continued)

OTHER PUBLICATIONS

The World Intellectual Property Organization (WIPO) International Search Report and Written Opinion for PCT/CN2016/106936 dated May 8, 2017 4 Pages.

*Primary Examiner* — Yuechuan Yu
(74) *Attorney, Agent, or Firm* — Anova Law Group, PLLC

(57) ABSTRACT

A plasma source includes a dielectric cylinder, a coil sounding a circumference of the dielectric cylinder, and coil case encasing the coil. The coil case has a first gas inlet disposed at a bottom area of a sidewall of the coil case for introducing a cooling gas to the coil case. The coil case has a first gas outlet disposed at a top wall of the coil case for venting the cooling gas from the coil case.

20 Claims, 2 Drawing Sheets

(56) References Cited

FOREIGN PATENT DOCUMENTS

| JP | 11067494 A | * | 3/1999 |
|----|------------|---|--------|
| JP | 2004063663 A | * | 2/2004 |
| JP | 2008198477 A | | 8/2008 |

* cited by examiner

PLASMA SOURCE AND SEMICONDUCTOR PROCESSING APPARATUS

CROSS-REFERENCE TO RELATED APPLICATION

This application is a continuation application of International Application No. PCT/CN2016/106936, filed on Nov. 23, 2016, which claims priority of Chinese Patent Application No. 201610635952.X, filed on Aug. 2, 2016. The entire contents of the above listed applications are incorporated herein by reference.

TECHNICAL FIELD

The present disclosure relates to the field of semiconductor manufacturing and, in particular, to a plasma source and a semiconductor processing apparatus.

BACKGROUND

To achieve a high etching selectivity and etching rate, current semiconductor processing apparatus often uses a remote high-density plasma (HDP) source. Under the action of a radio frequency coil (a stereo coil) with applied power, the HDP source can be used to generate a plasma inside a plasma generation chamber. The plasma generation chamber is often made of insulating materials, such as ceramics, and has a cylindrical shape. The plasma generation chamber is therefore referred to as a "dielectric cylinder" hereinafter.

SUMMARY

One aspect of the present disclosure includes a plasma source. The plasma source includes a dielectric cylinder, a coil sounding a circumference of the dielectric cylinder, and coil case encasing the coil. The coil case has a first gas inlet disposed at a bottom area of a sidewall of the coil case for introducing a cooling gas to the coil case. The coil case has a first gas outlet disposed at a top wall of the coil case for venting the cooling gas from the coil case.

Another aspect of the present disclosure provides a semiconductor processing apparatus. The semiconductor processing apparatus includes a reaction chamber and a plasma source. An opening is disposed on a top wall of the reaction chamber. The plasma source includes a dielectric cylinder, a coil sounding a circumference of the dielectric cylinder, and coil case encasing the coil. The coil case has a first gas inlet disposed at a bottom area of a sidewall of the coil case for introducing a cooling gas to the coil case. The coil case has a first gas outlet disposed at a top wall of the coil case for venting the cooling gas from the coil case. The coil case, the dielectric cylinder, and the top wall of the reaction chamber from an enclosed space.

Other aspects or embodiments of the present disclosure can be understood by professionals skilled in the art in light of the description, the claims, and the drawings of the present disclosure.

DESCRIPTION OF THE DRAWINGS

The following drawings are merely for illustrative purposes according to various embodiments and are not intended to limit the scope of the present disclosure.

DETAILED DESCRIPTION

To enable those skilled in the art to better understand the technical solutions of the present disclosure, the plasma source and semiconductor processing apparatus provided by the present disclosure are described in detail below with reference to the accompanying drawings.

Figure 1:
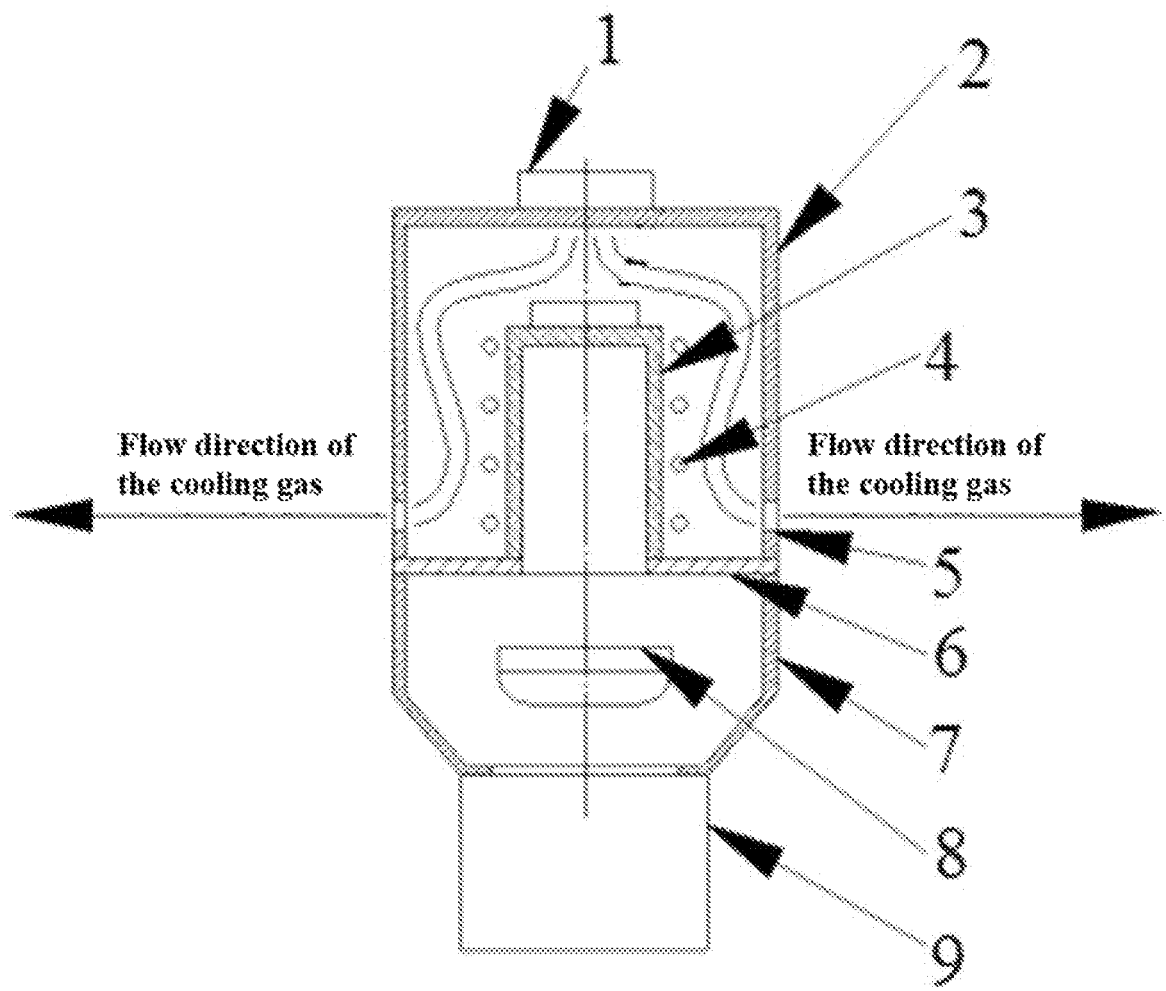
FIG. 1 is a cross-sectional view of a conventional semiconductor processing apparatus.

FIG. 1 is a cross-sectional view of a conventional semiconductor processing apparatus. As shown in FIG. 1, the conventional semiconductor processing apparatus includes a reaction chamber and a plasma source. The reaction chamber is constituted by a sidewall 7 and a top cover 6 with an opening. The reaction chamber includes a chuck 8 for carrying a wafer. A vacuuming device 9 is also disposed at the bottom of the reaction chamber for venting exhaust gases. The plasma source includes a radio frequency (RF) coil 4, a dielectric cylinder 3, a coil case 2, and a fan 1. The dielectric cylinder 3 covers the top cover 6. An opening of the dielectric cylinder 3 covers an opening of the top cap 6. That is, the opening of the dielectric cylinder 3 communicates with the opening of the top cap 6. The RF coil 4 is disposed around a circumference of the dielectric cylinder 3. The coil case 2 covers a circumference of the RF coil 4. The coil case 2, the top cap 6, and the dielectric cylinder 3 form an enclosed space. In addition, a gas inlet is disposed at the top of the coil case 2, and a gas outlet 5 is disposed at the bottom area of the sidewall of the coil case 2. The fan 1 is disposed adjacent to the gas inlet of the coil case 2. A cooling gas entering the enclosed space through the gas inlet, flowing from top to bottom, and being exhausted by the gas outlet 5, so as to dissipate the heat of the dielectric cylinder 3.

The above semiconductor processing apparatus inevitably has the following problems in practical applications. One of the heat dissipation modes of the dielectric cylinder 3 is dissipating heat by convection. When there is no gas cooling (e.g., when the fan 1 is not working), the gas inside the enclosed space becomes lighter and can rise due to heating. The gas flow direction is from the bottom to the top, forming a natural convection. When the fan 1 is working, the cooling gas is introduced to the enclosed space. The cooling gas flows from the top to the bottom, forming a force convection. However, the direction of the forced convection is opposite to the direction of the natural convection. The natural convection can hinder the forced convection, lowering the speed of the heat convection, thereby reducing the heat dissipation capability of the semiconductor processing apparatus.

To solve the above technical problem, the present disclosure provides a cooling mechanism of a plasma and a semiconductor processing apparatus, which can reduce the resistance of heat convection and increase heat convection speed, thereby improving the heat dissipation capacity of the semiconductor processing apparatus.

Figure 2:
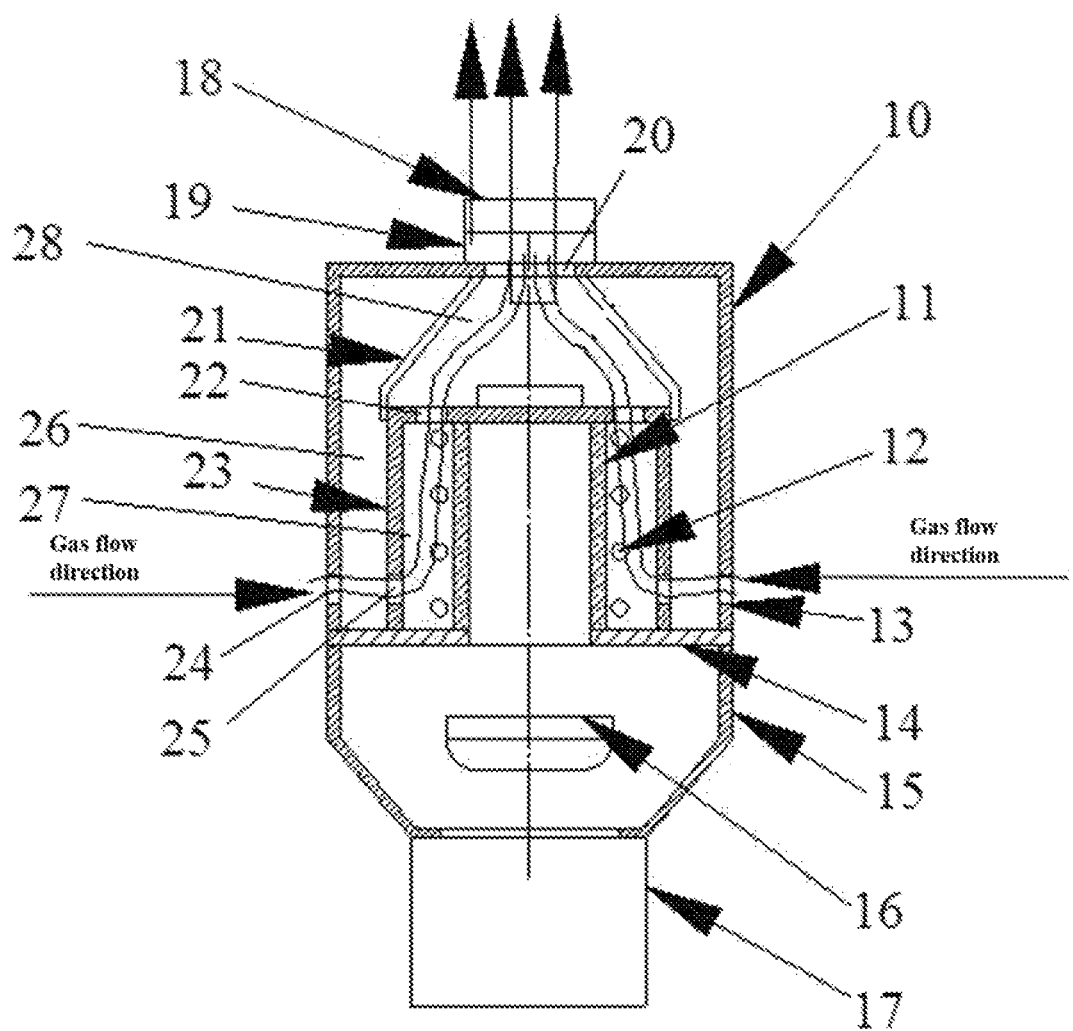
FIG. 2 is a cross-sectional view of a semiconductor processing apparatus including a plasma source according to some embodiments of the present disclosure.

FIG. 2 is a cross-sectional view of an example of a semiconductor processing apparatus including a plasma source according to some embodiments of the present disclosure. Referring to FIG. 2, the plasma source includes a dielectric cylinder 11, a coil 12 surrounding a circumference of the dielectric cylinder 11, and a coil case 10 covering the circumference of the coil 12. The dielectric cylinder 11 is usually made of insulating materials such as ceramics. The coil 12 is a stereo coil and can introduce radio frequency energy into the dielectric cylinder 11 by applying radio frequency power to the coil 12 to form a plasma inside the dielectric cylinder 11.

A first gas inlet 24 is disposed at a bottom area of a sidewall of the coil case 10 to convey a cooling gas to an interior space 26 of the coil case 10. In some embodiments, there may be a plurality of first gas inlets 24 symmetrically distributed along the circumferential direction of the coil case 10 to improve the distribution uniformity of the cooling gas in the interior space 26 of the coil case 10. A first gas outlet 20 is disposed on a top wall of the coil case 10, e.g., at a central position of the top wall, to ensure symmetric distribution of the gas flow.

In some embodiments, a first gas exhausting device 18 is disposed corresponding to the first gas outlet 20 for exhausting the cooling gas from the coil case 10 through the first gas outlet 20. The gas exhausting device 18 can be a gas exhausting fan. Using the gas exhausting device 18, a forced convection with a direction from bottom to top can be formed in the coil case 10. The direction of the forced convection is consistent with the direction of natural convection, reducing the resistance of the heat convection and increasing the speed of the heat convection, thereby improving the heat dissipation capability of the apparatus. In addition, the gas exhausting device 18 can also increase the flow rate of the cooling gas in the coil case 10, so that the cooling efficiency can be improved. In practical applications, the gas exhausting device 18 can also be omitted. In this case, the cooling gas entering the coil case 10 from the first gas inlet 24 can still flow from the bottom to the top and be exhausted from the first gas outlet 20. The flow direction of the cooling gas is consistent with the direction of natural convection, reducing the resistance of the heat convection and increasing the speed of the heat convection, thereby improving the heat dissipation capability of the apparatus.

In some embodiments, the plasma source further includes a temperature control sleeve 23 which is disposed in the coil case 10. The temperature control sleeve 23 and the dielectric cylinder 11 form a first space 27. In addition, a second gas inlet 25 is disposed at the bottom area of the sidewall of the temperature control sleeve 23. The cooling gas in the interior space 26 of the coil case 10 can enter the first space 27 through the second gas inlet 25. A second gas outlet 22 is disposed at a top wall of the temperature control sleeve 23. The second gas outlet 22 can exhaust the cooling gas out from the first space 27. The cooling gas can enter the interior space 26 of the coil case 10 through the first gas inlet 24, enter the first space 27 via the second gas inlet 25, and flow from the bottom to the top. The cooling gas can be exhausted out from the first space 27 via the second the gas outlet 22, and finally can be exhausted out from the coil case 10 by the gas exhausting device 18 via the first gas outlet 20.

Using the temperature control sleeve 23, the flow of the heated gas can be separated from other parts in the coil case 10, and the flow of the cooling gas can be sufficiently in contact with the dielectric cylinder 11. As such, the heat exchange efficiency between the cooling gas flow and the dielectric cylinder 11 can be improved, and the cooling effect can be improved.

Further, in some embodiments, there may be a plurality of second gas inlets 25. The plurality of second gas inlets are symmetrically distributed along the circumferential direction of the temperature control sleeve 23 to make the distribution of the cooling gas entering the first space 27 more uniform, thereby improving the cooling uniformity. In addition, in some embodiments, the number of the first gas inlets 24 is the same as the number of the second gas inlets 25, and each of the first gas inlets 24 is in one-to-one correspondence with each of the second gas inlets 25. As such, most of the cooling gas can enter the interior space 26 of the coil case 10 through the first gas inlet 24, and directly enter the first space 27 through the corresponding second gas inlet 25, reducing the flow path of the cooling gas, thereby increasing the cooling efficiency. The one-to-one correspondence can be the number of the first gas inlet 24 is the same as the number of the second gas inlet 25. A location of each first gas inlet 24 is in one-to-one correspondence with a location of each second gas inlet 25. In some other embodiments, the number of the first gas inlet 24 can be less or more than the number of the second gas inlet 25.

In some embodiments, a plurality of second gas outlets 22 may be included. The plurality of second gas outlets 22 may be symmetrically distributed along the circumferential direction of the temperature control sleeve 23 to improve the stability and uniformity of the gas flow in the first space 27, thereby improving the cooling uniformity.

In some embodiments, the plasma source further includes a gas deflector 21 disposed in the coil case 10. The gas deflector 21 may have a cylindrical shape. The gas deflector 21 may have another shape, which is not limited by the present disclosure. One open end of the gas deflector 21 covers the first gas inlet 20 of the top wall of the coil case 10, and an inner wall of the other open end of the gas deflector 21 encloses the top wall of the temperature control sleeve 23. The gas deflector 21, the top wall of the coil case 10, and the top wall of the temperature control sleeve 23 can constitute the second space 28. The first gas outlet 20 and the second gas outlet 22 are disposed in the second space 28. In this way, under the guidance and restraint of the gas deflector 21, the gas flow out through the second gas outlet 22 can smoothly flow to the first gas outlet 20. That is, using the gas deflector 21 can avoid gas retarding in the coil case 10. Further, in some embodiments, the gas deflector 21 has a tapered ring shape. A size of the top opening of the gas deflector 21 is smaller than a size of the bottom opening of the gas deflector 21, which can cause the gas flow to gather toward the first gas outlet 20. As such, the direction of the gas flow can be controlled, and the gas can be more smoothly and quickly exhausted from the first gas outlet 20.

In some embodiments, the plasma source further includes a heat dissipating device 19. The heat dissipating device 19 can be configured to cool the gas exhausted from the first gas outlet 20. The heat dissipating device 19 may be a heat sink. The heat sink may be composed of a windingly distributed cooling duct. The cooling duct is disposed adjacent to the first gas outlet 20. Cooling water introduced into the cooling duct can cool the gas flowing through the first gas outlet 20. Using the heat dissipating device 19, the gas exhausted by the gas exhausting device 18 can be directly vented into the factory exhaust or the atmosphere, thereby simplifying a gas discharging process.

Another aspect of the present disclosure also provides a semiconductor processing apparatus including a reaction chamber and a plasma source. As shown in FIG. 2, the reaction chamber is constituted by a sidewall 15 and a top cover 14. The top cover 14 includes an opening. The reaction chamber includes a chuck 16 for carrying a wafer. A vacuuming device 17 for venting exhaust gases is also disposed at the bottom of the reaction chamber.

The plasma source may be a plasma source described above. For the heat dissipation mode, references can be made to above embodiments, and details are not described herein again. Below describes a positional relationship between the plasma source and the reaction chamber. The plasma source includes a dielectric cylinder 11, a coil 12 surrounding a circumference of the dielectric cylinder 11, and a coil case 10 housed around the coil 12. The dielectric cylinder 11 is disposed on the top cover 14 of the reaction chamber and communicates with the opening of the top cover 14. The coil case 10, the dielectric cylinder 11 and the top cover 14 of the reaction chamber together form an enclosed space 26.

The semiconductor processing apparatus provided by embodiments of the disclosure use the plasma source described above. The resistance of the heat convection can be reduced, and the speed of the heat convection can be increased, thereby improving the heat dissipation capability of the apparatus.

The technical solutions provided by the present disclosure have the following beneficial effects.

For the plasma source provided by the present disclosure, the first gas inlet is disposed at the bottom area of the sidewall of the coil case and the first gas outlet is disposed at the top wall of the coil case. As such, the cooling gas in the coil case can flow from bottom to top. The flow direction of the cooling gas id consistent with the direction of the natural heat convection, reducing the resistance of the heat convection and increasing the speed of the heat convection, and thereby improving the heat dissipation capability of the semiconductor processing apparatus.

The semiconductor processing apparatus provided by the present disclosure can reduce the resistance of the heat convection and increasing the speed of the heat convection by adopting the above plasma source provided by the present disclosure, thereby improving the heat dissipation capability of the semiconductor processing apparatus.

It is to be understood that the above embodiments are merely exemplary embodiments employed to explain the principles of the disclosure, but the disclosure is not limited thereto. Various modifications and improvements can be made by those skilled in the art without departing from the spirit and scope of the disclosure. These modifications and improvements fall within the scope of the disclosure.

What is claimed is:

1. A plasma source comprising:
   a dielectric cylinder;
   a coil surrounding a circumference of the dielectric cylinder;
   a coil case encasing the coil, wherein the coil case has a first gas inlet disposed at a bottom area of a sidewall of the coil case for introducing a cooling gas to the coil case; and the coil case has a first gas outlet disposed at a top wall of the coil case for venting the cooling gas from the coil case, a space being formed, in the coil case, between the first gas outlet and a top wall of the dielectric cylinder; and
   a gas deflector arranged in the space and configured to provide an upward gas channel to direct the cooling gas in the space to the first gas outlet.

2. The plasma source of claim 1, further comprising a temperature control sleeve disposed in the coil case, wherein:
   the space is a first space;
   a second space is formed between the temperature control sleeve and the dielectric cylinder;
   a second gas inlet is disposed in a bottom area of a sidewall of the temperature control sleeve for introducing the cooling gas into the second space; and
   a second gas outlet is disposed on a top wall of the temperature control sleeve, the second gas outlet for venting the cooling gas from the second space into the first space.

3. The plasma source of claim 2, further comprising a plurality of second gas inlets symmetrically distributed along a circumferential direction of the temperature control sleeve.

4. The plasma source of claim 3, further comprising a plurality of first gas inlets symmetrically distributed along a circumferential direction of the coil case.

5. The plasma source of claim 4, wherein a number of the plurality of first gas inlets and a number of the plurality of second gas inlets are identical, the plurality of first gas inlets and the plurality of second gas inlets being configured in a one-to-one correspondence.

6. The plasma source of claim 2, further comprising a plurality of second gas outlets symmetrically distributed along a circumferential direction of the temperature control sleeve.

7. The plasma source of claim 2, wherein the cooling gas enters, through the second gas outlet, the gas deflector, and is vented out of the gas deflector from the first gas outlet.

8. The plasma source of claim 7, wherein the gas deflector has a horn shape, and a size of a top opening of the gas deflector is smaller than a size of a bottom opening of the gas deflector.

9. The plasma source of claim 1, further comprising a heat dissipating device disposed adjacent to the first gas outlet and configured to cool down gases vented from the first gas outlet.

10. The plasma source of claim 1, further comprising a gas exhausting device disposed adjacent to the first gas outlet and configured to exhaust the cooling gas from the coil case through the first gas outlet.

11. A semiconductor processing apparatus comprising a reaction chamber and a plasma source, an opening being disposed on a top wall of the reaction chamber, wherein the plasma source comprises:
   a dielectric cylinder disposed at a top of the reaction chamber and communicating with the opening of the reaction chamber;
   a coil surrounding a circumference of the dielectric cylinder;
   a coil case encasing the coil; and
   a gas deflector,
   wherein:
      the coil case has a first gas inlet disposed at a bottom area of a sidewall of the coil case for introducing a cooling gas to the coil case;
      the coil case has a first gas outlet disposed at a top wall of the coil case for venting the cooling gas from the coil case, a space being formed, in the coil case, between the first gas outlet and a top wall of the dielectric cylinder;
      the gas deflector is arranged in the space and configured to provide an upward gas channel to direct the cooling gas in the space to the first gas outlet; and
      the coil case, the dielectric cylinder, and the top wall of the reaction chamber form an enclosed space.

12. The semiconductor processing apparatus of claim 11, wherein:
   the space is a first space;
   the plasma source further comprises a temperature control sleeve disposed in the coil case;
   a second space is formed between the temperature control sleeve and the dielectric cylinder;

a second gas inlet is disposed in a bottom area of a sidewall of the temperature control sleeve for introducing the cooling gas into the second space; and a second gas outlet is disposed on a top wall of the temperature control sleeve, the second gas outlet for venting the cooling gas from the second space into the first space.

13. The semiconductor processing apparatus of claim 12, wherein the plasma source further comprises a plurality of second gas inlets symmetrically distributed along a circumferential direction of the temperature control sleeve.

14. The semiconductor processing apparatus of claim 13, wherein the plasma source further comprises a plurality of first gas inlets symmetrically distributed along a circumferential direction of the coil case.

15. The semiconductor processing apparatus of claim 14, wherein a number of the plurality of first gas inlets and a number of the plurality of second gas inlets are identical, the plurality of first gas inlets and the plurality of second gas inlets being configured in a one-to-one correspondence.

16. The semiconductor processing apparatus of claim 12, wherein the plasma source further comprises a plurality of second gas outlets symmetrically distributed along a circumferential direction of the temperature control sleeve.

17. The semiconductor processing apparatus of claim 12, wherein the cooling gas enters, through the second gas outlet, the gas deflector, and is vented out of the gas deflector from the first gas outlet.

18. The semiconductor processing apparatus of claim 17, wherein the gas deflector has a horn shape, and a size of a top opening of the gas deflector is smaller than a size of a bottom opening of the gas deflector.

19. The semiconductor processing apparatus of claim 11, the plasma source further comprises a heat dissipating device disposed adjacent to the first gas outlet and configured to cool down gases vented from the first gas outlet.

20. The semiconductor processing apparatus of claim 11, the plasma source further comprises a gas exhausting device disposed adjacent to the first gas outlet and configured to exhaust the cooling gas from the coil case through the first gas outlet.

* * * * *